(12) United States Patent
Gerber et al.

(10) Patent No.: US 10,816,614 B2
(45) Date of Patent: Oct. 27, 2020

(54) MAGNETIC FIELD SENSING SYSTEMS AND METHODS

(71) Applicant: Ramot at Tel-Aviv University Ltd., Tel-Aviv (IL)

(72) Inventors: Alexander Gerber, Tel-Aviv (IL); Gil Markovich, Tel-Aviv (IL); Leah Ben Gur, Tzur-Yigal (IL); Einat Tirosh, Ramat-Gan (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 116 days.

(21) Appl. No.: 16/077,497

(22) PCT Filed: Feb. 14, 2017

(86) PCT No.: PCT/IL2017/050186
§ 371 (c)(1),
(2) Date: Aug. 13, 2018

(87) PCT Pub. No.: WO2017/138006
PCT Pub. Date: Aug. 17, 2017

(65) Prior Publication Data
US 2019/0041472 A1    Feb. 7, 2019

Related U.S. Application Data

(60) Provisional application No. 62/295,082, filed on Feb. 14, 2016.

(51) Int. Cl.
*G01R 33/07*    (2006.01)
*G01R 33/09*    (2006.01)
(Continued)

(52) U.S. Cl.
CPC .......... *G01R 33/07* (2013.01); *G01R 33/093* (2013.01); *H01L 43/06* (2013.01); *B82Y 25/00* (2013.01)

(58) Field of Classification Search
CPC ............. G01N 21/75; G01N 33/54373; G01N 21/7743; G01N 21/552; G01R 33/07;
(Continued)

(56) References Cited

U.S. PATENT DOCUMENTS 3,596,114 A * 7/1971 Maupin .................. H01L 27/22
                                                       327/480
3,858,145 A * 12/1974 Sulich .................. H01F 7/0252
                                                       338/32 H
(Continued)

FOREIGN PATENT DOCUMENTS

EP          1814172        8/2007
WO    WO 2017/138006       8/2017

OTHER PUBLICATIONS

International Search Report and the Written Opinion dated Jun. 4, 2017 From the International Searching Authority Re. Application No. PCT/IL2017/050186. (25 Pages).
(Continued)

Primary Examiner — Lee E Rodak (57) ABSTRACT

A magnetic field sensor system comprises an electrically conducting film of ferromagnetic nanoparticles printed directly on a supporting structure, and electrically conducting contacts coupled to the film for injecting an electric current into the film and measuring a voltage generated across said film responsive to said injected current in a direction that is generally perpendicular to the current direction in the plane of the film.

19 Claims, 5 Drawing Sheets

(51) Int. Cl.
  *H01L 43/06* (2006.01)
  *B82Y 25/00* (2011.01)
(58) Field of Classification Search
  CPC .............. G01R 33/093; G01R 33/0011; G01R 33/0094; G01R 33/06; G01R 33/096; B82Y 25/00; H01L 2924/0002; H01L 43/06
  See application file for complete search history.

(56) References Cited

U.S. PATENT DOCUMENTS

| | | | |
|---|---|---|---|
| 5,652,445 A * | 7/1997 | Johnson | G11C 11/1673 257/295 |
| 5,922,537 A | 7/1999 | Ewart et al. | |
| 6,794,862 B2 | 9/2004 | Gelber | |
| 2002/0180429 A1 * | 12/2002 | Gerber | G01R 33/07 324/251 |
| 2004/0137275 A1 | 7/2004 | Jander et al. | |
| 2004/0164840 A1 | 8/2004 | Xiao et al. | |
| 2005/0018345 A1 | 1/2005 | Gerber | |
| 2006/0163744 A1 | 7/2006 | Vanheusden et al. | |
| 2009/0001983 A1 * | 1/2009 | Wittkowski | G01R 33/06 324/260 |
| 2009/0053512 A1 * | 2/2009 | Pyun | G11B 5/712 428/336 |
| 2010/0148764 A1 * | 6/2010 | Abe | G01D 5/145 324/207.25 |
| 2012/0326714 A1 | 12/2012 | Kamaushenko et al. | |
| 2015/0323615 A1 | 11/2015 | Kennedy et al. | |

OTHER PUBLICATIONS

Supplementary European Search Report and the European Search Opinion dated Sep. 23, 2019 From the European Patent Office Re. Application No. 17749994.4. (9 Pages).

Ben Gur et al. "Extraordinary Hall-Effect in Colloidal Magnetic Nanoparticle Films", Journal of Magnetism and Magnetic Materials, XP029890124, 426: 178-182, Available Online Nov. 22, 2016.

Makarov et al. "Printable Magnetoelectronics", ChemPhysChem, XP055621559, 14(9): 1771-1776, Published Online Jun. 24, 2013.

* cited by examiner

MAGNETIC FIELD SENSING SYSTEMS AND METHODS

RELATED APPLICATIONS

This application claims the benefit of priority of U.S. Provisional Patent Application No. 62/295,082 filed Feb. 14, 2016, the contents of which are incorporated by reference as if fully set forth herein.

FIELD AND BACKGROUND OF THE INVENTION

The present invention, in some embodiments thereof, relates to magnetic field sensors, more particularly, but not exclusively, to magnetic field sensing systems comprising ferromagnetic nanoparticles (NPs), method of fabricating the same and applications utilizing thereof.

A method for measuring magnetic field is to utilize the extraordinary Hall Effect, which generates an electrical potential in a conductive magnetic material. The potential generated is directly dependent on an electric current flowing in the material and on the magnetization of the film (which depends on the applied external magnetic field) perpendicular to the current flowing in the plane of a sample. Typical systems include a ferromagnetic conductor having a general rectangular film-like shape.

A current I flows between opposite faces of the conductor that are perpendicular, e.g., to the x axis. A magnetic field B is applied, e.g., along the z-axis (perpendicular to the film). This causes a magnetization M in the conductor in direction z perpendicular to the plane of the film. The field B and magnetization M act on moving current carriers in the ferromagnetic conductor to generate a Hall voltage $V_H$ between faces of the conductor that are perpendicular to the x and z axes. $V_H$ typically satisfies the relation $V_H=I(R_nB+R_{EHE}M)$, where $R_n$ is the normal Hall coefficient that represents the effect of Lorentz forces on the current carriers in the ferromagnetic conductor, and $R_{EHE}$ is the extraordinary Hall coefficient, a characteristic of ferromagnetic conductors, and represents the effect of spin-dependent scattering of electrons in the presence of magnetic polarization.

U.S. Pat. No. 6,794,862 [1], the contents of which are hereby incorporated by reference, discloses a magnetic field sensor, including an insulating substrate and a conductive thin film deposited on the substrate. The thin film consists of a material having an extraordinary Hall coefficient. The sensor also includes conductors coupled to the thin film for injecting a current into the film and measuring a voltage generated across the thin film responsive to the injected current.

U.S. Patent Publication No. 20120326714 [2] discloses a method for producing a magnetic functional element for resistance sensors with a magnetic material that has a giant magnetoresistance (GMR) effect. The material is deposited as a film on a substrate by thin film technologies, and is then removed from the substrate. During or subsequently to the removal, the film is divided into several components that are processed with a liquid and are applied to a substrate by means of printing technologies.

SUMMARY OF THE INVENTION

The object of the invention is to provide simple and cost-effective production of magnetic field sensing systems having a significant extraordinary Hall Effect signal. The object is attained according to the invention by utilizing a printed film comprising conductive nanoparticles with ferromagnetic properties and measuring the Hall voltage (EHE), namely, the potential generated perpendicular to an electrical current flowing across the printed film.

According to an aspect of some embodiments of the present invention there is provided a magnetic field sensor system. The system comprises an electrically conducting film of ferromagnetic nanoparticles printed directly on a supporting structure, and electrically conducting contacts coupled to said film for injecting an electric current into the film and measuring a voltage generated across said film responsive to said injected current in a direction that is generally perpendicular to the current direction in the plane of the film.

According to an aspect of some embodiments of the present invention there is provided a method of sensing. The method comprising injecting an electrical current via the electrically conducting contacts of the system as delineated hereinabove, and measuring a voltage generated across said film responsively to said injected current in a direction that is generally perpendicular to the current direction in the plane of the film.

According to an aspect of some embodiments of the present invention there is provided a switching system. The system comprising the magnetic field sensor system delineated hereinabove.

According to an aspect of some embodiments of the present invention there is provided a motion sensing system. The system comprising the magnetic field sensor system delineated hereinabove.

According to an aspect of some embodiments of the present invention there is provided a rotation sensing system. The system comprising the magnetic field sensor system delineated hereinabove.

According to an aspect of some embodiments of the present invention there is provided a printed circuit board, comprising the magnetic field sensor system delineated above.

According to an aspect of some embodiments of the present invention there is provided a method of fabricating a magnetic field sensor. The method comprising printing a film of ferromagnetic nanoparticles directly on a supporting structure, and coupling electrically conducting contacts to said film.

According to some embodiments of the invention the system or method, wherein said film of ferromagnetic nanoparticles are printed directly on a supporting structure to form an aggregate of said ferromagnetic nanoparticles on said supporting structure.

According to some embodiments of the invention the system or method, wherein said film having a magnetic field sensitivity at about zero applied magnetic field of at least about 0.1 milliTesla.

According to some embodiments of the invention the system or method, wherein said electrically conducting contacts are also printed.

According to some embodiments of the invention the system or method, wherein the nanoparticles film is electronically conductive.

According to some embodiments of the invention the system or method, wherein the substrate is 3D-printed.

According to some embodiments of the invention, the system or method wherein the nanoparticles thin film is detached from the substrate surface.

According to some embodiments of the invention, the system and method wherein the nanoparticles are coated with a protective layer.

According to some embodiments of the invention, the system and method wherein the protective layer comprises a polyvinyl pyrrolidone (PVP) or carboxymethyl cellulose (CMC) or polyethylene glycol (PEG) or Gum Arabic or polyvinyl alcohol (PVA).

According to some embodiments of the invention the system or method, wherein the resistivity of said film is at least 2 times larger than a characteristic bulk resistivity of a ferromagnetic material forming said nanoparticles.

According to some embodiments of the invention the system or method, wherein a roughness of said film is smaller or of the same order of magnitude as a thickness of said film.

According to some embodiments of the invention the system or method, wherein a thickness of said film is at least 10 nm.

According to some embodiments of the invention the system or method as delineated hereinabove, wherein a diameter of said nanoparticles is from about 3 to about 30 nm.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to magnetic field sensors, more particularly, but not exclusively, to magnetic field sensing systems comprising ferromagnetic nanoparticles, method of fabricating the same and applications utilizing thereof.

Typical systems utilizing the ordinary Hall Effect are semiconductors. Some embodiments of the present invention make a use of the extraordinary Hall Effect. This may be done using a ferromagnetic conductor having a Hall bar geometry or any other including a rectangular shape.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The recent development of printed electronics technology is motivated by the promise of low-cost, high volume, high-throughput production of electronic components or devices which are lightweight and small, thin and flexible, inexpensive and disposable. Printed electronics is not a substitute for conventional silicon-based electronics with a high integration density and switching speed, but is oriented towards low-cost and high volume printed circuits market segments where the high performance of conventional electronics is not required.

Modern printed electronics is very general and includes not only printable interconnects, but also optoelectronics and magnetoelectronics. Printed magnetoelectronics requires development of materials and devices sensitive to magnetic field, similar to the modern silicon-based magnetoelectronics. Recent developments in magnetoelectronics relate to the field of spintronics and, in particular, to the effects of giant magnetoresistance (GMR) and tunnelling magnetoresistance (TMR). Both GMR and TMR phenomena arise due to sensitivity of the spin dependent conductivity in heterogeneous magnetic systems to the relative orientation of the local magnetic moments: high conductivity for parallel moments and low for antiparallel. Specific mechanisms of GMR and TMR are different: GMR is due to spin-dependent scattering in metallic heterogeneous ferromagnets, multilayers and granular mixtures, whether nonmagnetic normal metal separates between ferromagnetic regions, while TMR is due to the spin dependent tunnelling across insulating spacers. Fabrication of printable ink with GMR properties has been recently reported [2]. In this approach GMR multilayers are fabricated by conventional vacuum deposition, detached from the substrate, ball milled to form micron size flakes and mixed with polymer solvent to form ink or paste.

The present disclosure describes a printable magnetic field sensitive magnetic nanoparticles (NPs) film operating on a different spin dependent phenomenon: the extraordinary Hall Effect (EHE). This effect generates voltage proportional to magnetization across a current carrying magnetic film. The origin of EHE is spin-orbit scattering that breaks the spatial symmetry of scattered electrons. When the EHE contribution exceeds significantly the ordinary Hall Effect the Hall voltage $V_H$ can be presented as:

$$V_H = \mu_0 R_{EHE} M I / t,$$

where I, t, $R_{EHE}$, and M represent the, applied current, film thickness, extraordinary Hall coefficient and magnetization normal to the film plane, respectively. $V_H$ is directly proportional to the magnetization M of the material and as such can be used for sensing magnetic field.

The effect has a relatively small value in bulk magnetic materials. Recently developed materials demonstrate dramatic enhancement of the EHE magnitude, which makes it attractive for a range of applications [A. Gerber and O. Riss, J. Nanoelectronics Optoelectronics 3, 35 (2008)].

Magnetic field sensitivity exceeding $10^4$ $\Omega$/T, which is an order of magnitude higher than the best sensitivity achieved in semiconducting Hall materials, has been reported in thin FePt/SiO$_2$ films.

The EHE signal typically increases with enhancement of electrical resistivity of the material. Thus, the performance of EHE sensors improves with imperfections, so that adding insulating impurities (e.g., SiO$_2$) into a ferromagnetic material (e.g., Ni) increases the resistivity and enhances of the EHE signal.

Some embodiments of the present invention provide a magnetic field sensor system. The system comprises a film of ferromagnetic nanoparticles printed directly on a supporting structure. The film can be printed using any technique known in the art, such as but not limited to inkjet printing or fused deposition modelling, or spin coating, roll coating, or spray coating, or dip coating, or flow coating, or doctor blade coating, or dispensing, or offset printing, or screen printing, or pad printing, or gravure printing, or flexography, or stencil printing, or imprinting, or xerography, or lithography, or nanoimprinting, or stamping, and the like.

Thin film ferromagnetic nanoparticles layer may be formed by conventional printing techniques on a surface region of a substrate, namely any region or section or area of a substrate surface. In some embodiments, the surface region is a single region or area of the surface, or a continuous region on said substrate, or the full surface of the substrate. The thin film layer is implemented from a ferromagnetic material such as iron, cobalt, or nickel, or from a combination or an alloy of these elements, or from any other ferromagnetic or ferrogmagnetic material. The substrate may serve as a mechanical support for the layer, and may be implemented from any material which does not interfere with the operation of the layer. Typically, the substrate may be of a solid material such as glass, quartz, paper, semiconductor, polymeric material, ceramic material. The substrate may also be printed using 3D printing techniques. Some non-limiting examples of 3D printed materials are polymers such as ABS, PLA, epoxy resins, photopolymers; and ceramic inks.

The thin film layer may also be formed on a substrate by conventional printing techniques (for example, ink-jet printing) in conjunction with standard lithographic procedures, such as by sputtering or electron beam deposition, or alternatively by any other means known in the art for forming a thin film on a substrate. Optionally, the substrate is cleaned prior to printing/deposition of the thin film layer, by conventional cleaning methods known in the art. For example, the substrate may be cleaned ultrasonically using a sequence of dilute hydrochloric acid, and/or ethanol, and/or acetone.

In some embodiments of the present invention, a protective layer is deposited on an upper face (top-most face) of the nanoparticles thin film layer, in order to protect it from oxidation of the nanoparticles. The protective layer may be any convenient insulator and/or surfactants, such as but not limited to, polyvinyl pyrrolidone (PVP) or carboxymethyl cellulolse (CMC), or polyethylene glycol (PEG) or Gum Arabic or polyvinyl alcohol (PVA).

By way of example, the nanoparticles layer may be generally rectangular in shape, or any geometrical shape such as an elliptical or irregular shape.

Electrically conducting contacts may be attached to opposite sides of the nanoparticles layer such that a current may be injected between these opposite sides. Voltage measuring conductors are attached opposite sides of the nanoparticles layer. The attachment of the current carrying and voltage measuring conductors may be performed by any means known in the art, such as utilizing chromium/gold pads as bonding pads between nanoparticles layer and the conductors. In the event that protective layer is overlaid on nanoparticles layer, contact windows for the pads are made in the protective layer.

In some embodiments of the present invention, the ink formulation for preparing the nanoparticles thin film may be formed by reducing a metal ion or metal complex to its metallic state. This may be carried out according to some embodiments of the present invention by providing, preferably under inert atmosphere such as under nitrogen, an ink formulation that comprises a metal ion precursor, such as nickel chloride hexa-hydrate; a reduction agent, such as sodium borohydride in a suitable solvent (for instance, ethylene glycol); and a complexing agent such as hydrazine hydrate. A surfactant may be added to the ink formulation, such as poly(N-vinyl-2-pyrrolidone). The ink formulation may be spread on a surface region of a substrate in any conventional printing technique, such as ink-jet printing, thereby reducing the metal ion or metal complex in the ink formulation to produce a final thin film comprising metallic nanoparticles. The thin film of nanoparticles may then be dried, for example, by vacuum oven overnight at a temperature of 100° C. and at a low pressure of 100 millibar under flow of inert gas.

In some embodiments of the present invention, the nanoparticles thin film may be detached from the substrate surface.

The system can further comprise electrically conducting contacts coupled to the film. In some embodiments of the invention, the electrically conducting contacts are also printed. The printing technique employed for printing the contacts is optionally and preferably, but not necessarily, the same as the printing technique employed for printing the film.

Typically, the resistivity of printed or ink-deposited films is significantly higher than resistivity of bulk crystal due to imperfection of fabrication process. Thus, the resistivity of the film is preferably at least 5 or at least 10 or at least 20 or at least 40 times larger than a characteristic bulk resistivity of a ferromagnetic material forming the nanoparticles.

In some embodiments of the present invention, the sensor system wherein the resistivity of the electrically conducting film is at most 100 k$\Omega$ per sq, or at most 2000$\Omega$ per sq, or at most 1000$\Omega$ per sq, or at most 500$\Omega$ per sq, or at most 200$\Omega$ per sq, or at most 100$\Omega$ per sq, or at most 50$\Omega$ per sq, or at most 40$\Omega$ per sq, or at most 30$\Omega$ per sq, or at most 20$\Omega$ per sq, between 1 to 1000$\Omega$ per sq, as determined when measuring a voltage generated across said film responsive to an injected current in a direction that is generally perpendicular to the current direction in the plane of the film.

The roughness of the film is preferably smaller than or of the same order of magnitude as the thickness of the film. In some embodiments, the mean thickness of the nanoparticles film is at least 10 nm or at least 20 nm or at least 40 nm or at least 80 nm or at least 100 nm or at least 200 nm or at least 300 nm or at least 400 nm or at least 500 nm or at least 600 nm or at least 700 nm or at least 800 nm or at least 900 nm, e.g., about 1 µm. Other mean thicknesses of less than 10 nm are also contemplated. In any of the above embodiments, the thickness of the film is preferably less than 1 mm. In some embodiments, the mean thickness of the nanoparticles film is between 10 nm to 500 nm; or between 10 nm or 20 nm or 40 nm or 80 nm or 100 nm, to 200 nm or 300 nm or 400 nm or 500 nm or 600 nm or 700 nm or 800 nm or 900 nm.

The diameter of the nanoparticles can be from about 1 to about 100 nm or from about 3 to about 70 nm or from about 3 to about 50 nm or from about 3 to about 30 nm or from about 4 to about 25 nm or from about 5 to about 20 nm. Other diameters are also contemplated.

The ferromagnetic nanoparticles are preferably made of a ferromagnetic or ferromagnetic material which comprises at least one substance selected from the group consisting of nickel, cobalt and iron. Nickel is more preferred over cobalt and iron since it exhibits relatively low oxidation compared to cobalt and iron, and since nickel has a lower coercive field than cobalt and iron. The lower coercive field provides more sensitivity at low magnetic field since the magnetization hysteresis curve crosses the magnetic field axis sufficiently close to the zero field point.

In use, an electrical current is injected via the electrically conducting contacts, and measuring a voltage generated across the film, generally perpendicular (e.g., with deviation from perpendicularity of less than 10° or less than 5° or less than)1° to the current direction in the plane of the film, responsively to the injected current.

The magnetic field sensor system may operate with direct current or alternating current.

In some embodiments, the measuring a voltage generated across said film responsive to said injected current in a direction that is generally perpendicular to the current direction in the plane of the film, is carried out by van der Pauw method. The van der Pauw technique involves a four-point probe placed around the edges of a sample and measuring the average resistivity of a sample.

The system of the present embodiments can be integrated into a printed circuit board, and be used in many applications, including, without limitation, as a switching system (e.g., a contactless switch), a motion sensing system, and a rotation sensing system, a rotational speed sensor, a position sensor, etc.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non-limiting fashion.

Methods

Example 1

Preparation of Ni Nanoparticles Coated with Poly(N-vinyl-2-pyrrolidone) in Ethylene Glycol Dispersion Nickel NPs were synthesized by a method of nickel ion reduction by borohydride in ethylene glycol. First, the precursor nickel chloride hexa-hydrate (4 mmol) and the surfactant poly(N-vinyl-2-pyrrolidone) with a molecular weight of 40,000 g\mol (PVP40) or 3,500 g/mol (0.013 mmol) were dissolved in ethylene glycol (16 mL) in sequence, resulting in a green solution. Then, hydrazine hydrate (30 mmol) was added, in order to form a $Ni^{+2}$-hydrazine complex (a purple solution). The temperature was selected so as to provide a stable complex. In the present example, the temperature was set to about 40° C., and after about 40 minutes the solution became bluish purple. The colour of the solution indicates the formation of $[Ni(N_2H_4)_3]^{+2}2Cl^-$ complex, which is different from $[Ni(N_2H_4)_6]^{+2}2Cl^-$ complex. The latter is unstable and decomposes to $NiCl_2 \cdot 4\text{-}5N_2H_4$.

A reducing agent, sodium borohydride (13 mmol dissolved in 700 μL of $H_2O$), was added under nitrogen atmosphere, in order to reduce the nickel ions to their metallic state. The solution was stirred for 1 hour until the black colour of the nickel NPs appeared. Afterwards, the flask was cooled to room temperature, and the NPs were isolated through centrifugation with acetone (3,500 RPM for 5 minutes) and re-dispersed in ethylene glycol. The product obtained was 5-20 nm size Ni nanoparticles coated with poly(N-vinyl-2-pyrrolidone) in ethylene glycol dispersion was kept in a glove box to minimize oxidation.

Example 2

Preparation of Ni Nanoparticles Coated with Poly(N-vinyl-2-pyrrolidone) in Ethylene Glycol Dispersion Nickel chloride hexa-hydrate (4 mmol) and the surfactant poly(N-vinyl-2-pyrrolidone) with a molecular weight of 40,000 g\mol (PVP40) or 3,500 g/mol (0.013 mmol) were dissolved in ethylene glycol (16 mL) in sequence. A reducing agent, sodium borohydride (13 mmol dissolved in 700 μL of $H_2O$), was added under nitrogen atmosphere, in order to reduce the nickel ions to their metallic state. The solution was stirred for 1 hour. Afterwards, the flask was cooled to room temperature, and the NPs were isolated through centrifugation with acetone (3,500 RPM for 5 minutes) and re-dispersed in ethylene glycol. The product was kept in a glove box to minimize oxidation.

Example 3

Preparation of Ni Nanoparticles Coated with CMC in Ethylene Glycol Dispersion

Nickel chloride hexa-hydrate (4 mmol) and 300 mg of the surfactant carboxymethyl cellulose (CMC) were dissolved in ethylene glycol (16 mL) in sequence. A reducing agent, sodium borohydride (13 mmol dissolved in 700 μL of $H_2O$), was added under nitrogen atmosphere, in order to reduce the nickel ions to their metallic state. The solution was stirred for 1 hour. Afterwards, the flask was cooled to room temperature, and the NPs were isolated through centrifugation with acetone (3,500 RPM for 5 minutes) and re-dispersed in ethylene glycol. The product was kept in a glove box to minimize oxidation.

Thin Film Preparation and Drying

Figure 1:
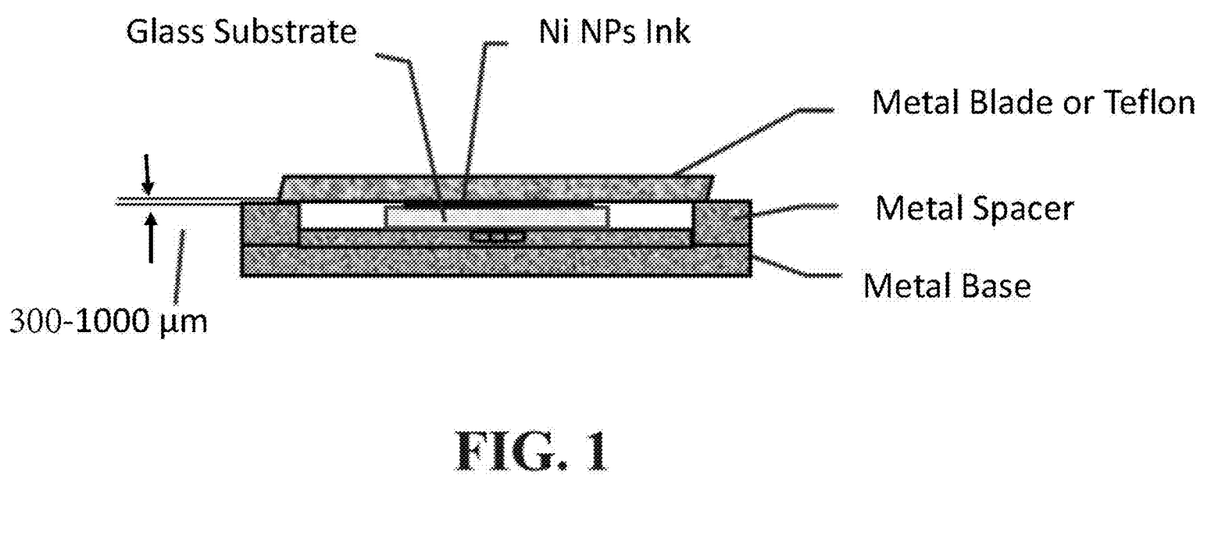
FIG. 1 is a schematic illustration of a bar coating device, according to some embodiments of the present invention.

In order to make 1-10 μm thick Ni NPs thin films (after drying), a home-made bar-coating device, as illustrated in Error! Reference source not found., was used.

A bar-coating device was built with two replaceable spacers, depending on the desired thickness of the layer. These spacers dictate the height of the spread solution. There is a designated place to place the substrate, between the spacers, with an "O-ring", and a slot that connects to a vacuum source, which keeps the substrate in place.

A metal blade was used to spread the concentrated Ni nanoparticle ink (30% by weight in ethylene glycol) on a glass substrate. Since the ink wetted the blade, a residue of ink was left on the blade during the coating process.

The thin Ni NPs film was dried in a vacuum oven with a base pressure of the order of about 10 millibar and temperature of about 100° C. for overnight drying for obtaining an electrically conducting nanoparticles film. Typically, a low pressure of about 100 millibar of a $H_2/N_2$ 5%/95% was flown through the vacuum oven during the first several hours of drying. For another sample, the heating was carried out in low vacuum of about 20 mbar without flowing $H_2/N_2$ gas.

EHE Measurements

Figure 2A:
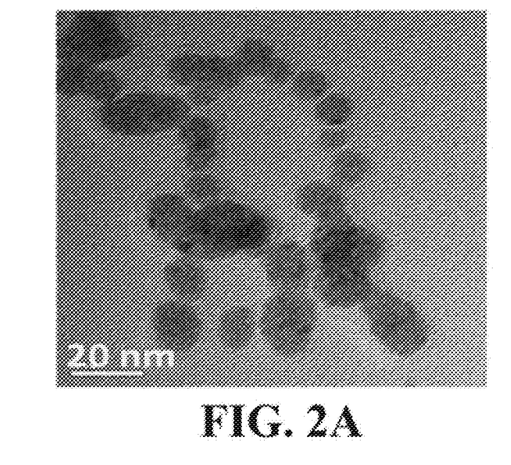
FIG. 2A is a transmission electron microscopy (TEM) micrograph of the Ni NPs of about 5-20 nm in size, according to some embodiments of the present invention.
Figure 2B:
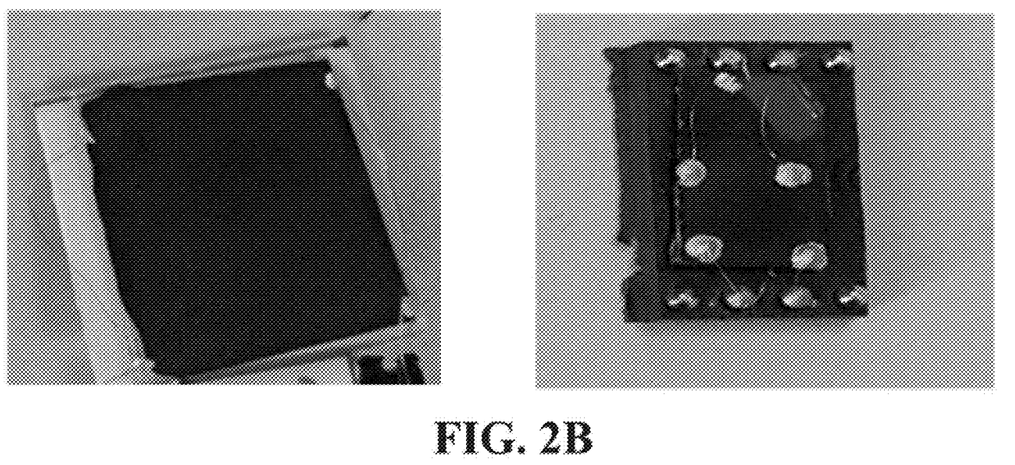
FIG. 2B are images of two examples of Ni NPs film wired for van der Pauw type EHE measurement (contacts at four corners of the film). The left image is ~2×2 cm$^2$ and the right image is ~1×1 cm$^2$, according to some embodiments of the present invention.

Sample according to Example 1 of the invention were placed on square glass chips and 4 electrical contact leads were glued by silver paint to the 4 corners of the film (as shown in FIG. 2B). The two samples showed difference only by size of the film (left ~2×2 $cm^2$, right ~1×1 $cm^2$ in FIG. 2B). This contact configuration was used for van der Pauw type Hall Effect measurement.

Results

The synthesis yielded Ni NPs in the size range of 3-20 nm as seen from the high resolution TEM image displayed in FIG. 2A. Each particle formed of a single Ni crystal. The dried nickel NPs films had a typical mean thickness of the order of 1 μm and roughness of the same scale, as measured by profilometry.

The Ni NPs films, deposited on glass slides were contacted by conductive silver paste to thin copper wires which were connected to the Hall measurement system. A comparison between a Hall Effect measurement of a Ni NPs film deposited on glass (open circles, y-axis on left side of graph) and a magnetization curve measurement of the Ni NPs powder (solid squares, y-axis on right side of graph), both at room temperature is presented in FIG. 3.

Figure 3:
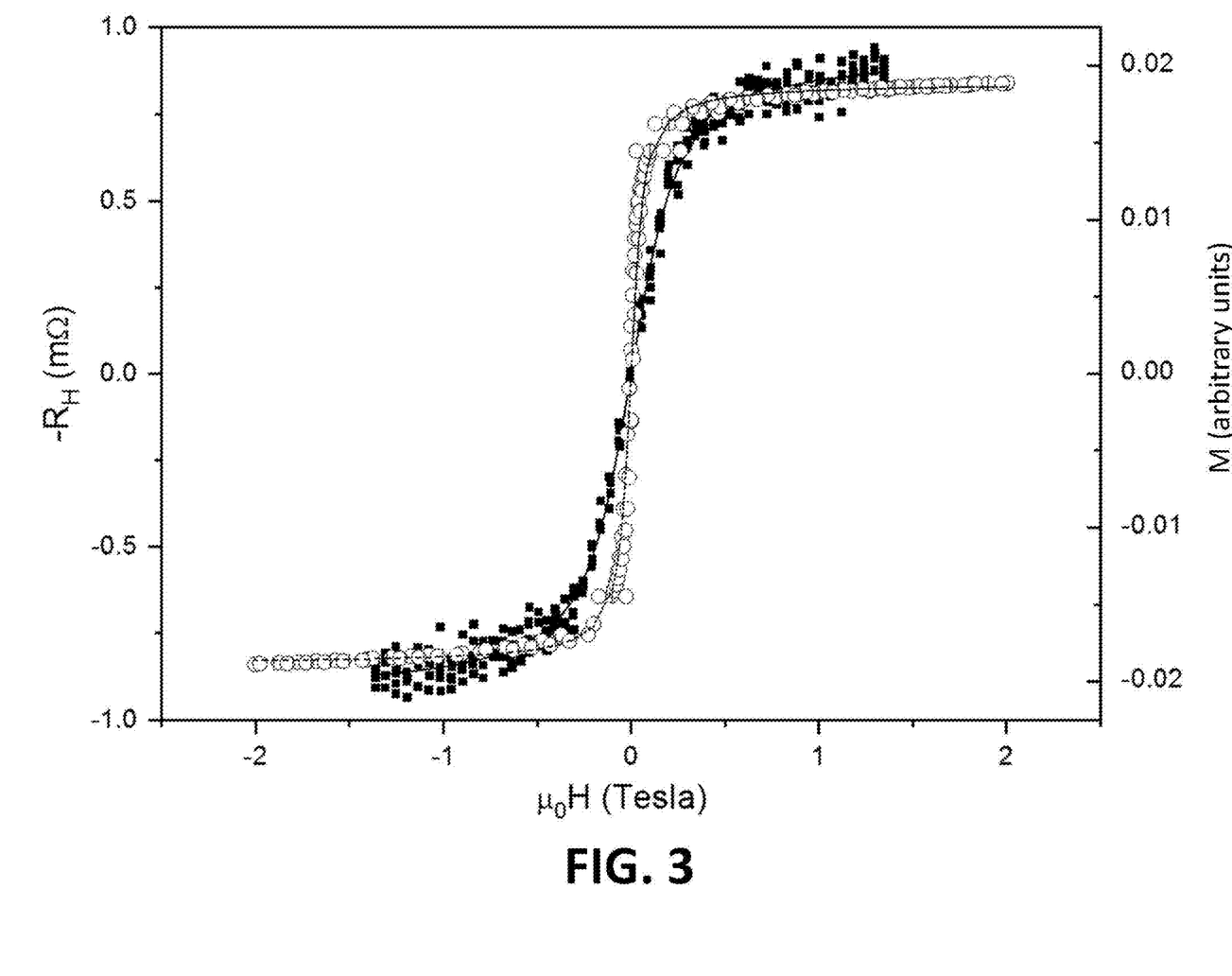
FIG. 3 shows magnetization (open circles) and EHE (solid squares) measurements of a ~1 µm thick film of Ni NPs of about 5-20 nm in size, according to some embodiments of the present invention.

As shown in FIG. 3, the EHE curve approximately follows the magnetization curve, with a slightly different slope. Without wishing to be bound to any particular theory, it is assumed that the slope difference is due to a difference in particle density (hence different inter-particle magnetic coupling) between the more compact film and the bulky NPs powder used for the magnetization measurement.

Figure 4A:
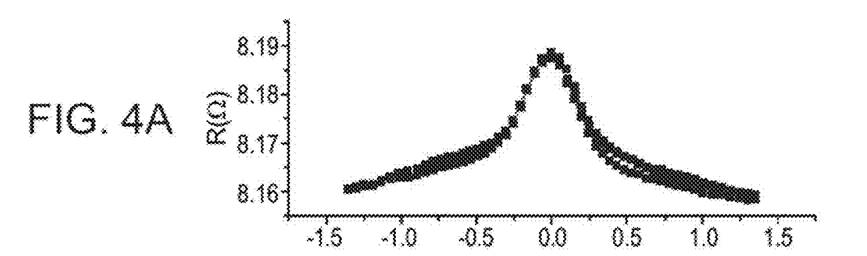
FIGS. 4A-4D show (a) MR curve of a film of Ni NPs, about 10 nm average size, measured with in-plane magnetic field swept up and down according to some embodiments of the present invention; (b) EHE measurement of the Ni NPs sample shown in FIG. 4A (with perpendicular magnetic field swept up and down); (c) MR curve of a film of Ni NPs, about 3 nm average size, according to some embodiments of the present invention; (d) EHE measurement of the 3 nm average size NPs film shown in FIG. 4C (open squares) and a month after the open squares measurement (solid triangles)
Figure 4B:
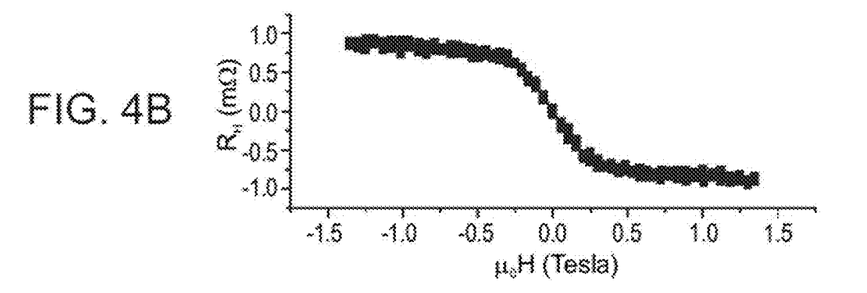
Figure 4C:
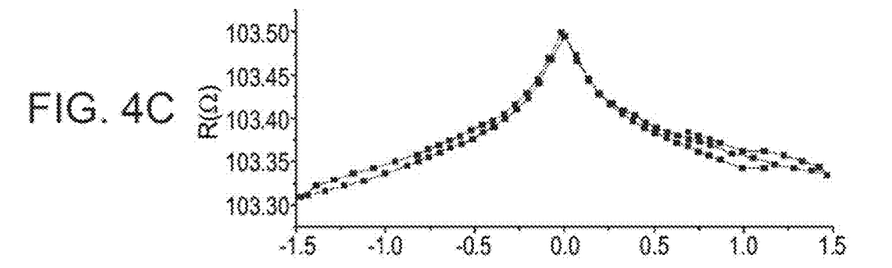
Figure 4D:
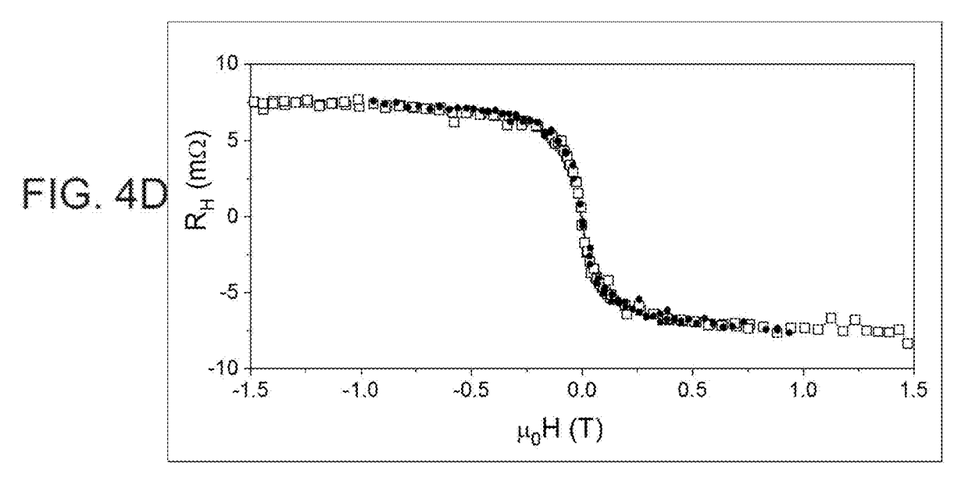

The EHE signal was also compared to the magnetoresistance (MR) within the same films depicted in FIGS. 4A-4D that display such a comparison for two other Ni NPs films, formed of substantially different NPs sizes (about 3 nm and about 10 nm, average size), in which MR curve of a film of Ni nanoparticles with 10 nm diameter was measured with in-plane magnetic field (FIG. 4A) and EHE measurement of the same Ni NP sample was measured with perpendicular magnetic field (FIG. 4B). In both cases the field was swept up and down. FIG. 4C shows MR curve of Ni nanoparticles with 3 nm diameter and FIG. 4D shows two EHE measurements of the 3 nm nanoparticles film. The solid triangles curve was measured over a month after the open squares curve. The advantage of the EHE measurement (FIGS. 4B and 4D) over MR (FIGS. 4A and 4C) for magnetic field sensing at low fields is that the slope of the MR curve around zero field is small, which makes the sensitivity of the MR to magnetic field at low fields (less than about 0.1 T) much lower than the sensitivity of the EHE which is maximal around zero field.

EHE was measured for about 50 different Ni NPs film samples and its value at saturating field (>0.5 T) was typically in the range of from about 1 to about 10 m$\Omega$, measured using currents in the range of from about 1 mA to about 10 mA.

Figures 5A, 5B:
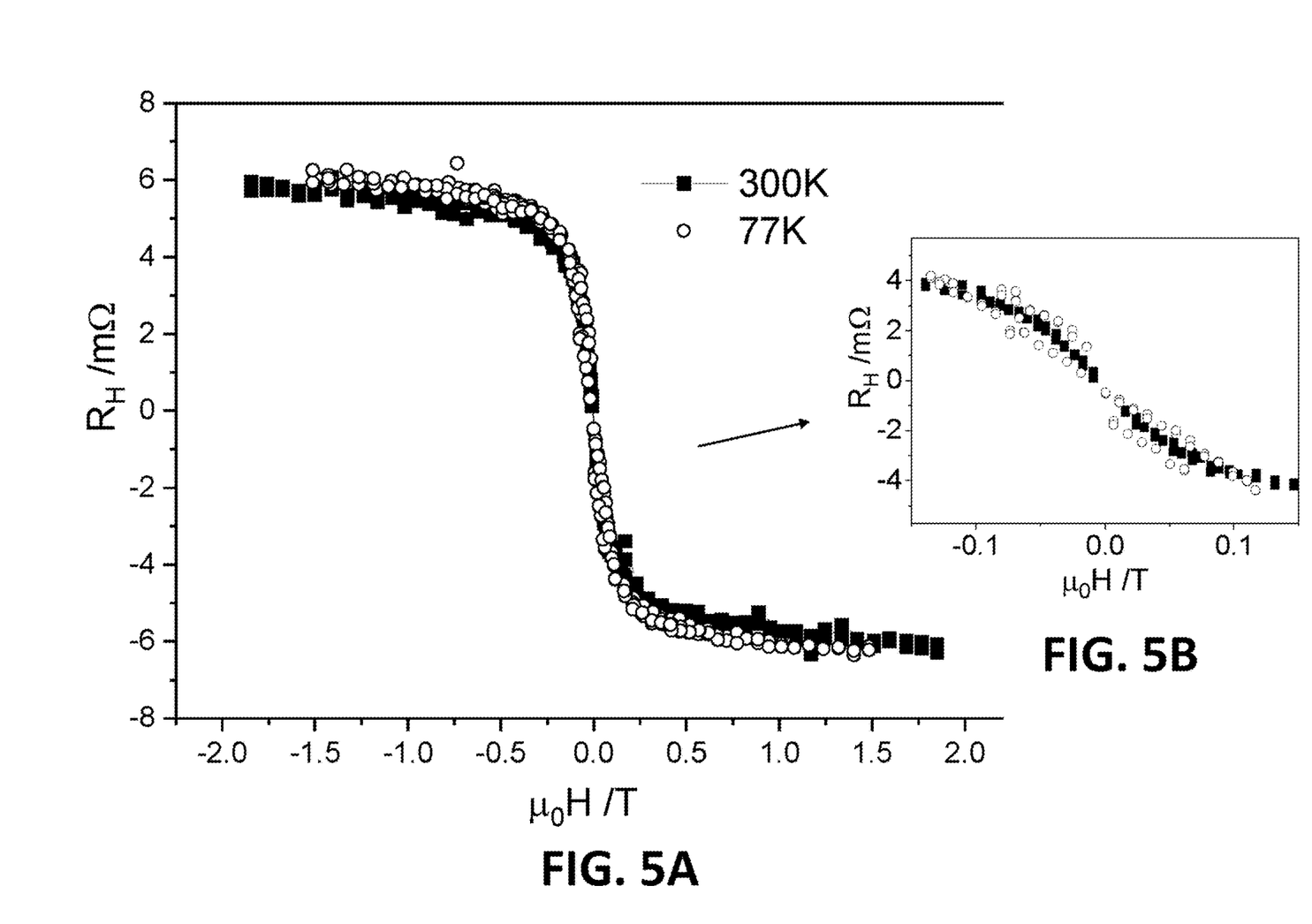
FIGS. 5A-5B show temperature dependence of the EHE for a film of 4 nm average size Ni NPs, according to some embodiments of the present invention.

The Ni NPs films exhibited a slight increase in resistance with increasing temperature, thus featuring a metallic-like conductivity. For example, the film used for the EHE measurement displayed in FIG. 5, which shows temperature dependence of the EHE of a film comprising Ni nanoparticles of about 4 nm diameter, had a resistance decrease from 20 to 18$\Omega$ on cooling from 300 to 77 K.

As shown in FIG. 5, the EHE is very weakly dependent on temperature, primarily through the increase in coercivity, which reflects the transition from a superparamagnetic state of the particles into a ferromagnetic one.

The present example demonstrates that by providing a film of NPs on a substrate, preferably followed by drying (e.g., vacuum drying) and mild heating, a conducting film which exhibits measurable EHE with a good signal-to-noise level and high field sensitivity around zero magnetic field, is obtained. These films can be used as magnetic sensors for various applications such as contactless switches, motion sensors and rotation sensors.

The film can alternatively be applied by a printing technique, such as but not limited to, inkjet printing. In preferred embodiments, the printing is combined with 3D printing of, for example, circuit boards, e.g., multilayer circuit boards. This provides a simple and low cost technique for the integration of magnetic sensors into 3D printed structures.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] U.S. Pat. No. 6,794,862.
[2] U.S. Patent Publication No. 20120326714.

What is claimed is:
1. A magnetic field sensor system, comprising:
an electrically conducting film of ferromagnetic nanoparticles, and
electrically conducting contacts coupled to said film for injecting an electric current into the film;
wherein the electrically conducting contacts are coupled to said film so as to allow measuring a voltage through a subset of the electrically conducting contacts, the voltage being generated across said film responsive to said injected current,
wherein the electrically conducting film comprises individual ferromagnetic nanoparticles coated with a polymeric or molecular surfactant layer, wherein each of the ferromagnetic nanoparticles is formed of a single crystal having a diameter of 3 to 30 nm; and
the electrically conducting film is sensitive to the Extraordinary Hall Effect.

2. A method of sensing, comprising injecting an electrical current via the electrically conducting contacts of the system of claim 1, and measuring a voltage generated across said film responsively to said injected current.

3. A switching system, comprising the magnetic field sensor system of claim 1.

4. A motion sensing system, comprising the magnetic field sensor system of claim 1.

5. A rotation sensing system, comprising the magnetic field sensor system of claim 1.

6. A printed circuit board, comprising the magnetic field sensor system of claim 1.

7. The system according to claim 1, wherein said ferromagnetic nanoparticles are printed directly on a supporting structure to form an aggregate of said ferromagnetic nanoparticles on said supporting structure.

8. The system according to claim 1, wherein said film has measurable magnetic field sensitivity when a magnetic field of about 0.1 mT is applied.

9. The system according to claim 1, wherein said electrically conducting contacts are printed.

10. The system according to claim 1, wherein the resistivity of said film is at least 2 times larger than a characteristic bulk resistivity of a ferromagnetic material forming said nanop articles.

11. The system according to claim 1, wherein a roughness of said film is smaller or of the same order of magnitude as a thickness of said film.

12. The system according to claim 11, wherein a thickness of said film is at least 10 nm.

13. The system according to claim 1, wherein said ferromagnetic material comprises at least one substance selected from the group consisting of nickel, cobalt and iron.

14. The system according to claim 1, wherein said film has magnetic field sensitivity of at least 2m'$\Omega$/T when a magnetic field up to a saturation point is applied.

15. The system according to claim 1, wherein an Extraordinary Hall Effect resistance of the film at a saturating magnetic field, measured using currents in the range of from about 1 mA to about 10 mA, is between about 1 to about 10 m$\Omega$.

16. The system according to claim 1, wherein an Extraordinary Hall Effect resistance of the film decreases by no more than approximately 10% when the film is cooled from 300 K to 77 K.

17. A method of fabricating a magnetic field sensor, comprising:
forming individual ferromagnetic nanoparticles coated with a polymeric or molecular surfactant layer, wherein each of the ferromagnetic nanoparticles is formed of a single crystal having a diameter of 3 to 30 nm;
printing a film of said individual ferromagnetic nanoparticles directly on a supporting structure, and
coupling electrically conducting contacts to said film so as to allow for injecting an electric current into the film and measuring a voltage generated across said film responsive to said injected current due to the Extraordinary Hall Effect.

18. The method as defined in claim 17, wherein:
the forming step comprises forming a dispersion of the ferromagnetic nanoparticles in ethylene glycol; and
the printing step comprises depositing the dispersion onto the supporting structure, and drying the deposited dispersion under vacuum and with application of heat of about 100C, to thereby produce a conducting film.

19. The method as defined in claim 17, wherein the ferromagnetic particles are formed from ferromagnetic material comprising at least one substance selected from a group consisting of nickel, cobalt, and iron, and the forming step comprises reducing the ferromagnetic material from a cationic state to a neutral state.

\* \* \* \* \*